United States Patent
Hossain et al.

(10) Patent No.: US 6,982,193 B2
(45) Date of Patent: Jan. 3, 2006

(54) METHOD OF FORMING A SUPER-JUNCTION SEMICONDUCTOR DEVICE

(75) Inventors: Zia Hossain, Tempe, AZ (US); Prasad Venkatraman, Gilbert, AZ (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 0 days.

(21) Appl. No.: 10/841,670

(22) Filed: May 10, 2004

(65) Prior Publication Data

US 2005/0250257 A1  Nov. 10, 2005

(51) Int. Cl.
*H01L 21/332* (2006.01)
*H01L 21/76* (2006.01)
*H01L 21/22* (2006.01)

(52) U.S. Cl. .................. 438/135; 438/420; 438/561
(58) Field of Classification Search ................ 438/135, 438/140, 197, 420, 561
See application file for complete search history.

(56) References Cited

U.S. PATENT DOCUMENTS

| | | | |
|---|---|---|---|
| 4,558,507 A * | 12/1985 | Okabayashi et al. | 438/301 |
| 5,216,275 A | 6/1993 | Chen | |
| 5,438,215 A | 8/1995 | Tihanyi | |
| 6,184,555 B1 | 2/2001 | Tihanyi et al. | |
| 6,274,904 B1 | 8/2001 | Tihanyi | |
| 6,307,246 B1 * | 10/2001 | Nitta et al. | 257/493 |
| 6,509,240 B2 | 1/2003 | Ren et al. | |
| 6,512,267 B2 | 1/2003 | Kinzer et al. | |
| 6,576,516 B1 * | 6/2003 | Blanchard | 438/268 |
| 6,608,350 B2 | 8/2003 | Kinzer et al. | |
| 6,821,824 B2 * | 11/2004 | Minato et al. | 438/138 |
| 2003/0008483 A1 * | 1/2003 | Sato et al. | 438/514 |
| 2005/0181558 A1 * | 8/2005 | Hshieh | 438/248 |
| 2005/0181564 A1 * | 8/2005 | Hshieh et al. | 438/270 |
| 2005/0181577 A1 * | 8/2005 | Hshieh | 438/427 |

* cited by examiner

*Primary Examiner*—Matthew Smith
*Assistant Examiner*—Lex H. Malsawma
(74) *Attorney, Agent, or Firm*—Robert F. Hightower

(57) ABSTRACT

In one embodiment, a transistor is formed to have alternating depletion and conduction regions that are formed by doping the depletion and conduction regions through an opening in a substrate of the transistor.

20 Claims, 10 Drawing Sheets

METHOD OF FORMING A SUPER-JUNCTION SEMICONDUCTOR DEVICE

BACKGROUND OF THE INVENTION

The present invention relates, in general, to electronics, and more particularly, to methods of forming semiconductor devices and structure.

In the past, the semiconductor industry utilized various methods and structures to form super-junction field effect devices. These devices typically had alternating P and N columns formed in a substrate with the active area of the field effect device overlying the alternating P and N columns. One example of such a super-junction field effect device was disclosed in U.S. Pat. No. 6,274,904 issued to Jeno Tihanyl et al on Aug. 14, 2001, which is hereby incorporated herein by reference. One problem with these prior structures was the manufacturing cost. Typically, the alternating P and N columns were formed by growing multiple thin N-type epitaxial layers and implanting each epitaxial layer with boron to form the P regions prior to growing the next epitaxial layer. Growing the multiple epitaxial layers required many processing steps, and aligning the P and N columns within each epitaxial layer was difficult. Implanting each epitaxial layer required precise alignment between the layers which also increased cost and reduced manufacturing yields.

In order to form the multiple P and N columns, a highly doped epitaxial layer was required. Sometimes the doping was greater than 5E15 atoms/cm$^2$. Because of the highly doped epitaxial layer, these alternating P and N columns were also required in the termination region of the field effect device. The complex termination region further increased the costs.

Accordingly, it is desirable to have a super-junction field effect device that does not require growing multiple epitaxial layers, that does not require a highly doped epitaxial layer, that has a simple termination structure, and that has reduced manufacturing cost.

For simplicity and clarity of illustration, elements in the figures are not necessarily to scale, and the same reference numbers in different figures denote the same elements. Additionally, descriptions and details of well-known steps and elements are omitted for simplicity of the description. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
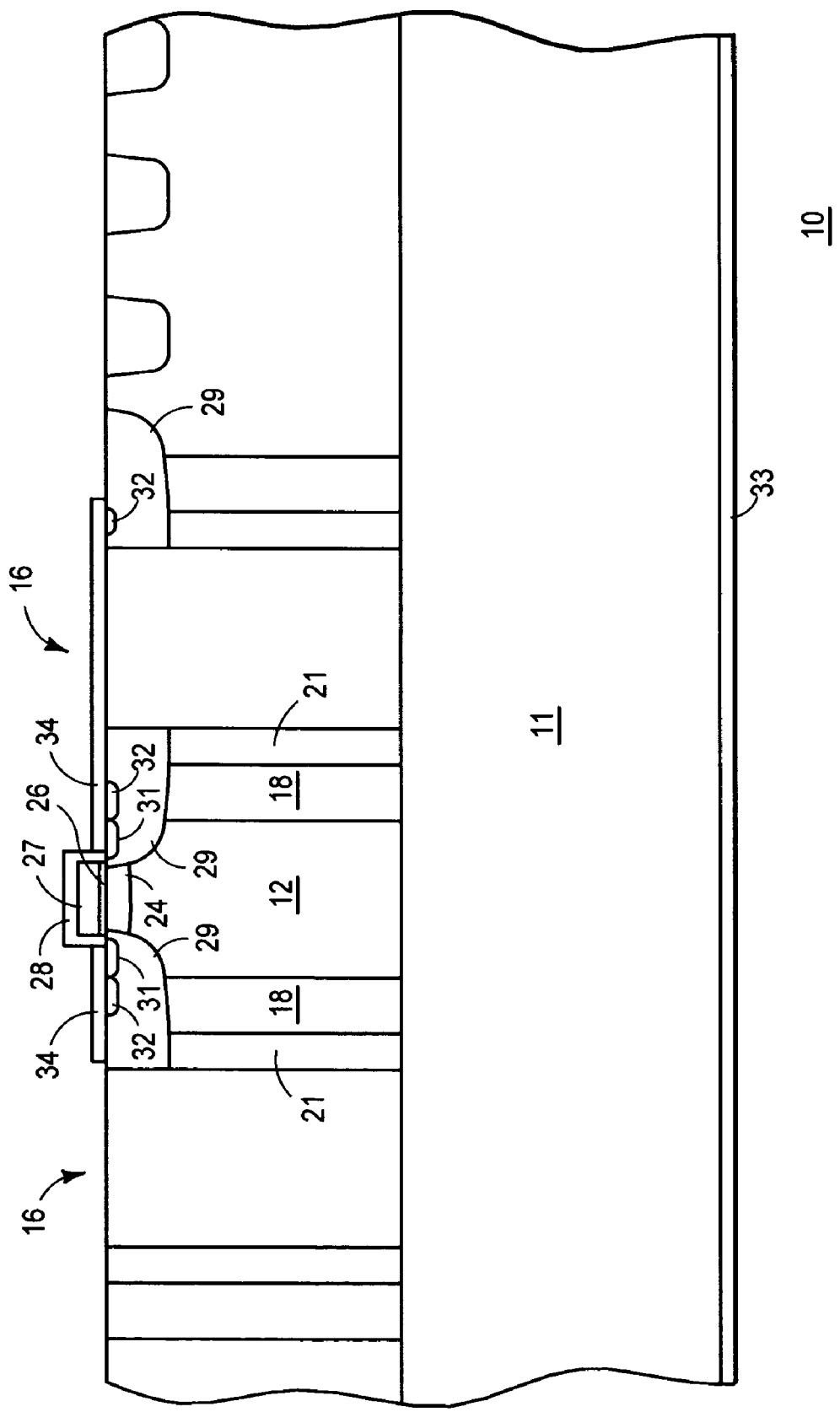
FIG. 1 schematically illustrates an enlarged cross-sectional portion of an embodiment of a super-junction field effect transistor in accordance with the present invention.
Figure 2:
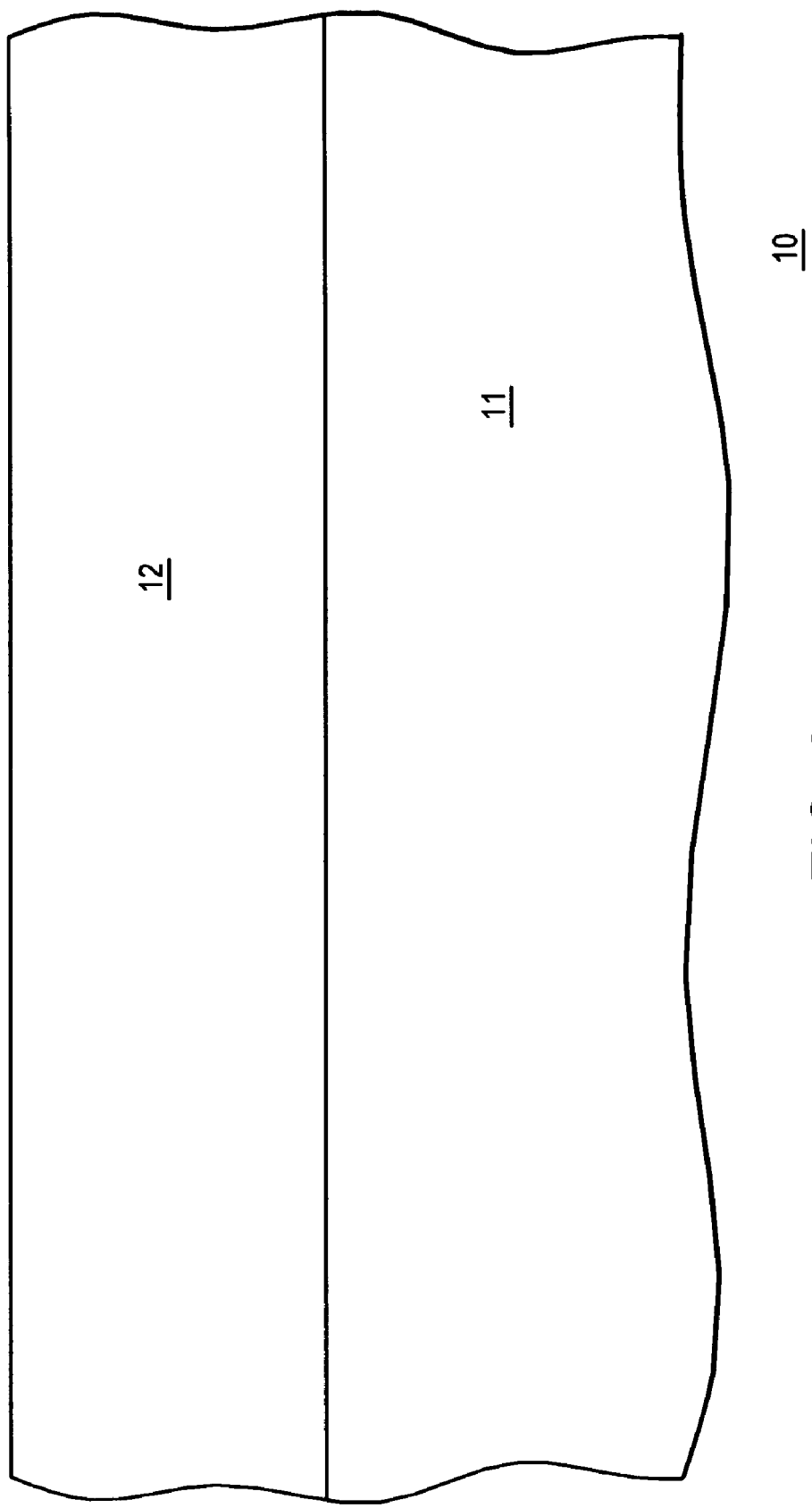
FIG. 2 schematically illustrates an enlarged cross-sectional portion of the super-junction field effect transistor of FIG. 1 at an early stage of an embodiment of a method in accordance with the present invention.

FIG. 1 schematically illustrates an enlarged cross-sectional portion of an embodiment of a vertical super-junction field effect transistor 10 that has good control of the breakdown voltage, low manufacturing cost, and a simple termination structure. Transistor 10 includes a first doped region 18 and a second doped region 21 that are a portion of a super-junction structure. As will be seen hereinafter, regions 18 and 21 are formed by methods that provide well-controlled charge balance within the super-junction structure. Transistor 10 is formed on a surface of a highly doped substrate 11 with a drain electrode 33 formed on an opposite surface of substrate 11.

Figure 3:
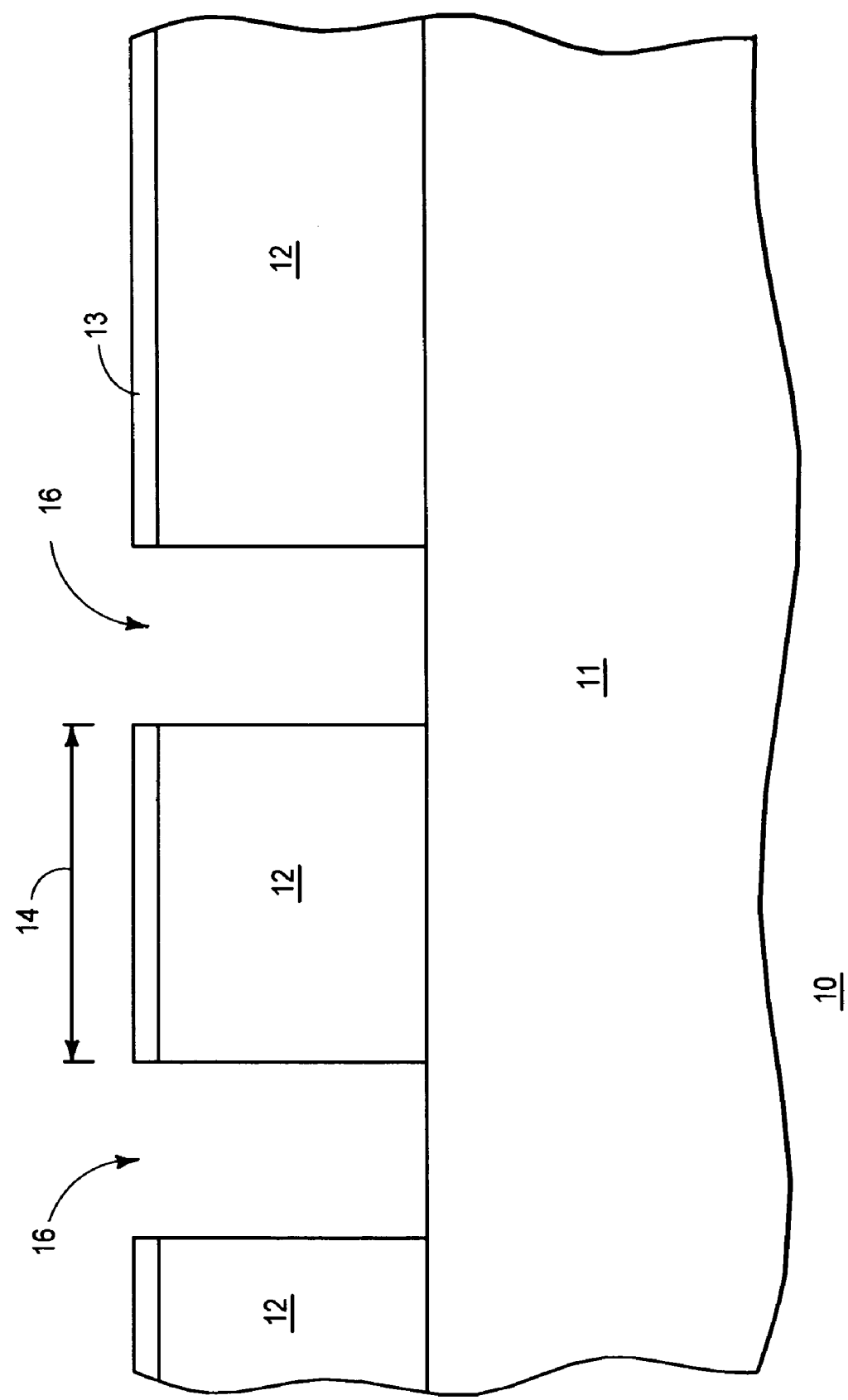
FIG. 3 through FIG. 7 schematically illustrate an enlarged cross-sectional portions of the super-junction field effect transistor of FIG. 1 at various stages of an embodiment of a method in accordance with the present invention.

FIG. 2 through FIG. 7 schematically illustrate portions of various stages of an embodiment of a method of forming transistor 10. This description will have various references to all of FIGS. 2 through 7. A lightly doped epitaxial layer 12 is formed on a first surface of highly doped substrate 11. Both substrate 11 and layer 12 may be either P-type or N-type material. In one embodiment, substrate 11 has an N-type doping concentration greater than about 1E16 atoms/cm$^3$ and preferably is about 1E19 atoms/cm$^3$. In such an embodiment, layer 12 generally has an N-type doping concentration that is less than about 1E15 atoms/cm$^3$ and preferably is about 2E14 atoms/cm$^3$ with a resistivity in the range of about twenty (20) ohm-centimeter. As illustrated in FIG. 3, a masking layer 13 is formed on layer 12 in order to aid in patterning proportions of layer 12. Typically, layer 13 is a material that can block dopants from entering the covered portion of layer 12, such as for example silicon dioxide. Openings 16 are formed through layer 13 and layer 12 and expose a portion of a first surface of substrate 11. Openings 16 generally are formed by trench formation techniques that are well known to those skilled in the art. Openings 16 are formed a first distance or distance 14 apart in order to leave a portion of layer 12 into which an active region of transistor 10 will be formed. As is well known in the art, transistor 10 may be one cell of many cells that are interconnected to form a multi-cell transistor. The structure of transistor 10 may be any of various shapes such as polygons or circular shapes and that openings 16 may be one continuous opening surrounding the active area of transistor 10. Additionally, openings 16 may have various horizontal cross-sectional shapes including a polygon or curved shapes such as circles, ellipsis, and the like.

Figure 4:
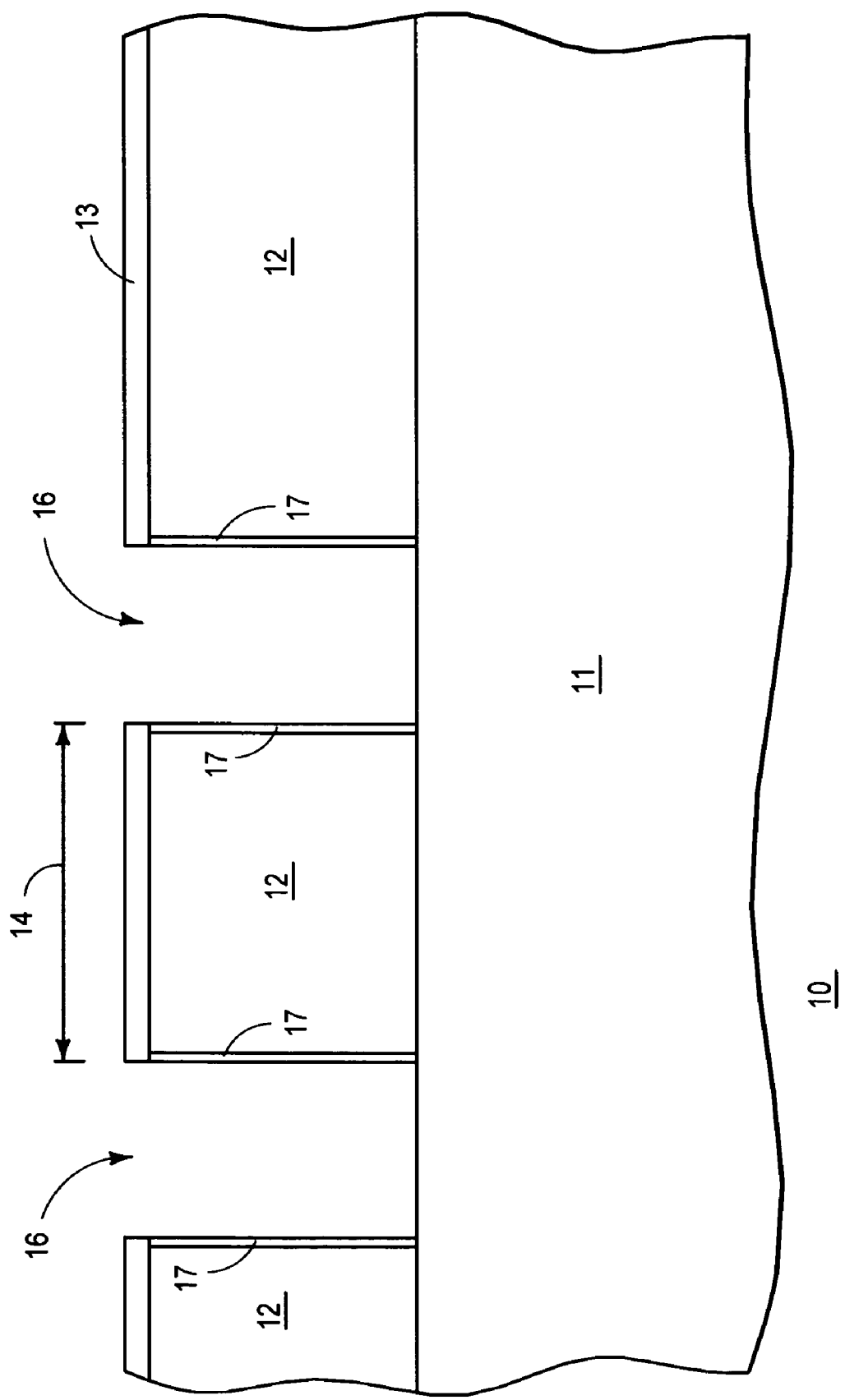
Figure 5:
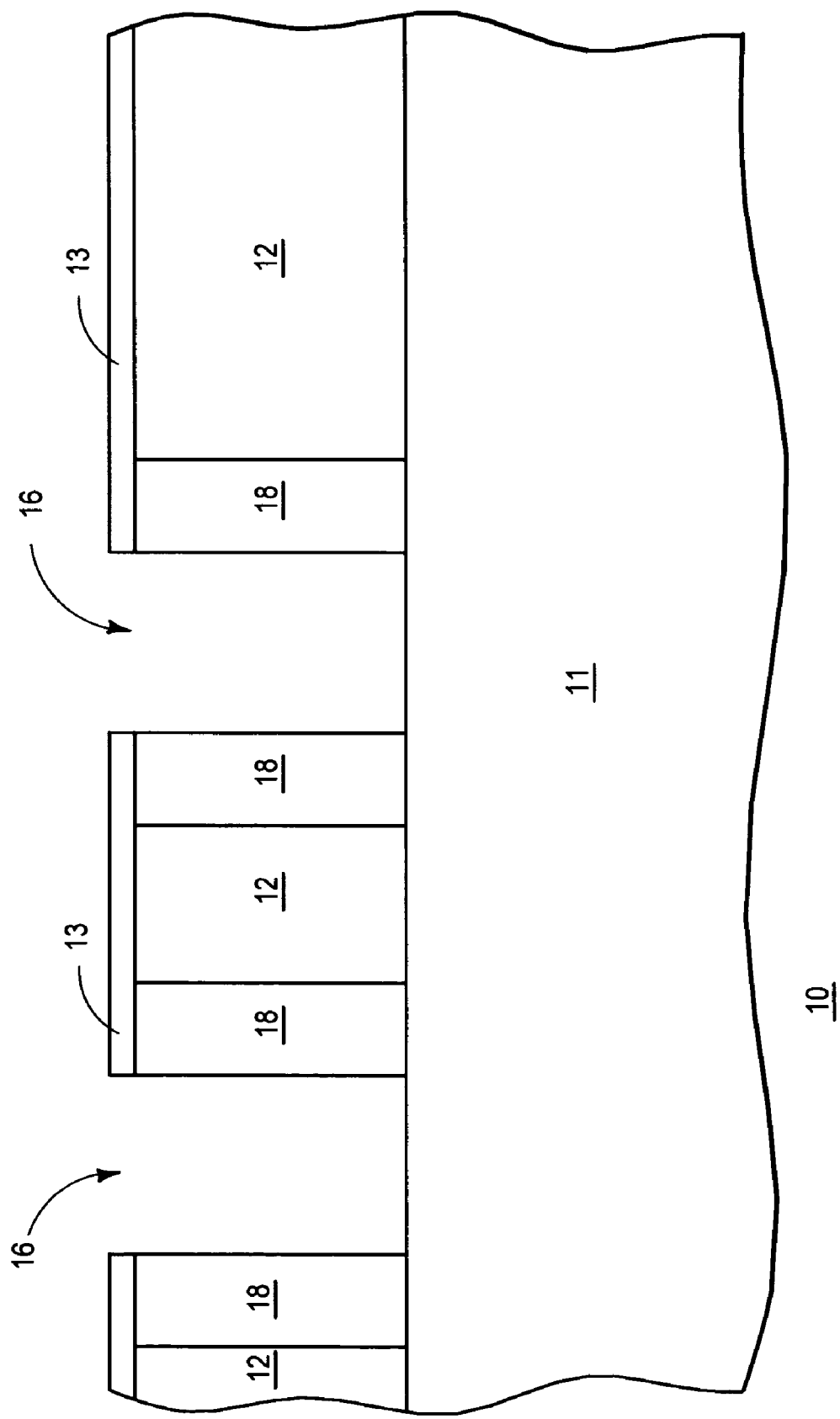

Referring to FIG. 4, a first portion of the sidewalls of openings 16 are doped by forming a doping material 17 along the sidewalls of openings 16. Material 17 generally has a conductivity type that is the same as that of layer 12 and will subsequently be used to form doped regions 18 within layer 12. Doping material 17 may be formed by various doping procedures including gas phase doping, angled implantation, and solid source doping such as depositing doped polysilicon on the sidewalls of openings 16. As will be appreciated by those skilled in the art, some methods, such as implanting and gas phase doping, form doping material 17 by doping a thin section of layer 12 along the sidewall of opening 16. In some embodiments, material 17 may not be formed on each sidewall of openings 16 but only on some of the sidewalls. In one embodiment, an angled implant is utilized to form material 17 on the sidewalls of opening 16. In this embodiment, the horizontal cross-sectional shape of openings 16 may require implants from several different directions in order to form material 17 on the different vertical sidewall surface of each opening 16. For example, a hexagonal shape has more sidewalls than a square shape and may require implants from more directions. For example, transistor 10 may be rotated during the implanting process in order to cover each of the sidewalls. Those skilled in the art will realize that the width of opening 16 must be sufficient to allow the doping material from the angled implant to be implanted substantially along the entire height or depth of the sidewalls of opening 16. In another embodiment, material 17 is formed by positioning an additional doping material onto the sidewalls of opening 16. The additional doping material may be doped polysilicon or doped silicon dioxide that is deposited onto the sidewalls and subsequently the dopants are diffused into layer 12. In both of these embodiments, the concentration of material 17 varies no greater than plus or minus ten percent (10%) along the vertical height of the sidewalls. Generally the dose in the sidewall is about 2E12 atoms/cm$^2$ and up to about 5E12 atoms/cm$^2$ greater than the desired resulting dose in order to compensate for subsequent counter-doping as will be seen further hereinafter. As illustrated in a general manner in FIG. 5, material 17 is subsequently utilized to form doped regions 18 extending laterally from the sidewalls of opening 16 into layer 12. Typically, an annealing operation is utilized to drive material 17 into layer 12 to form doped regions 18.

Figure 6:
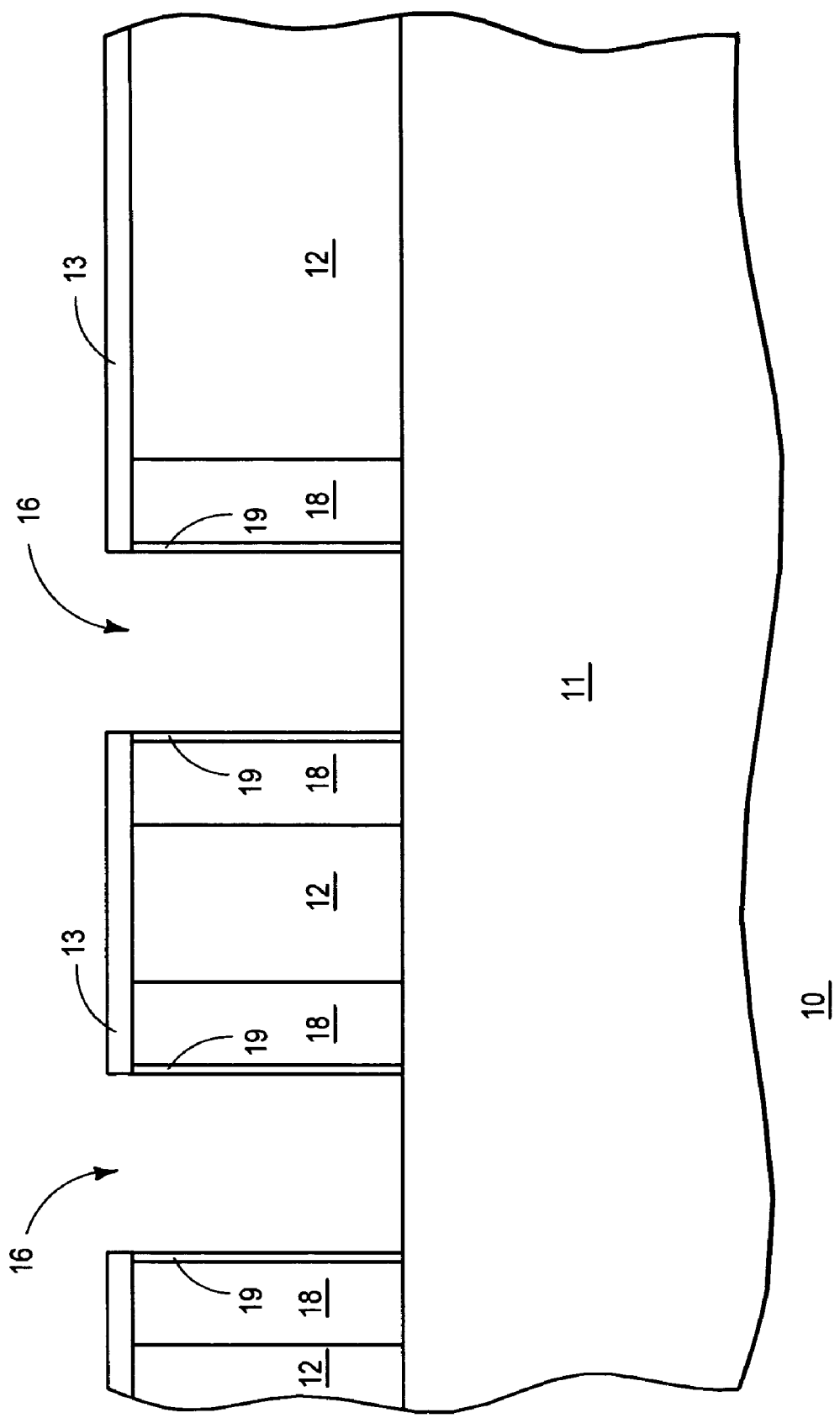
Figure 7:
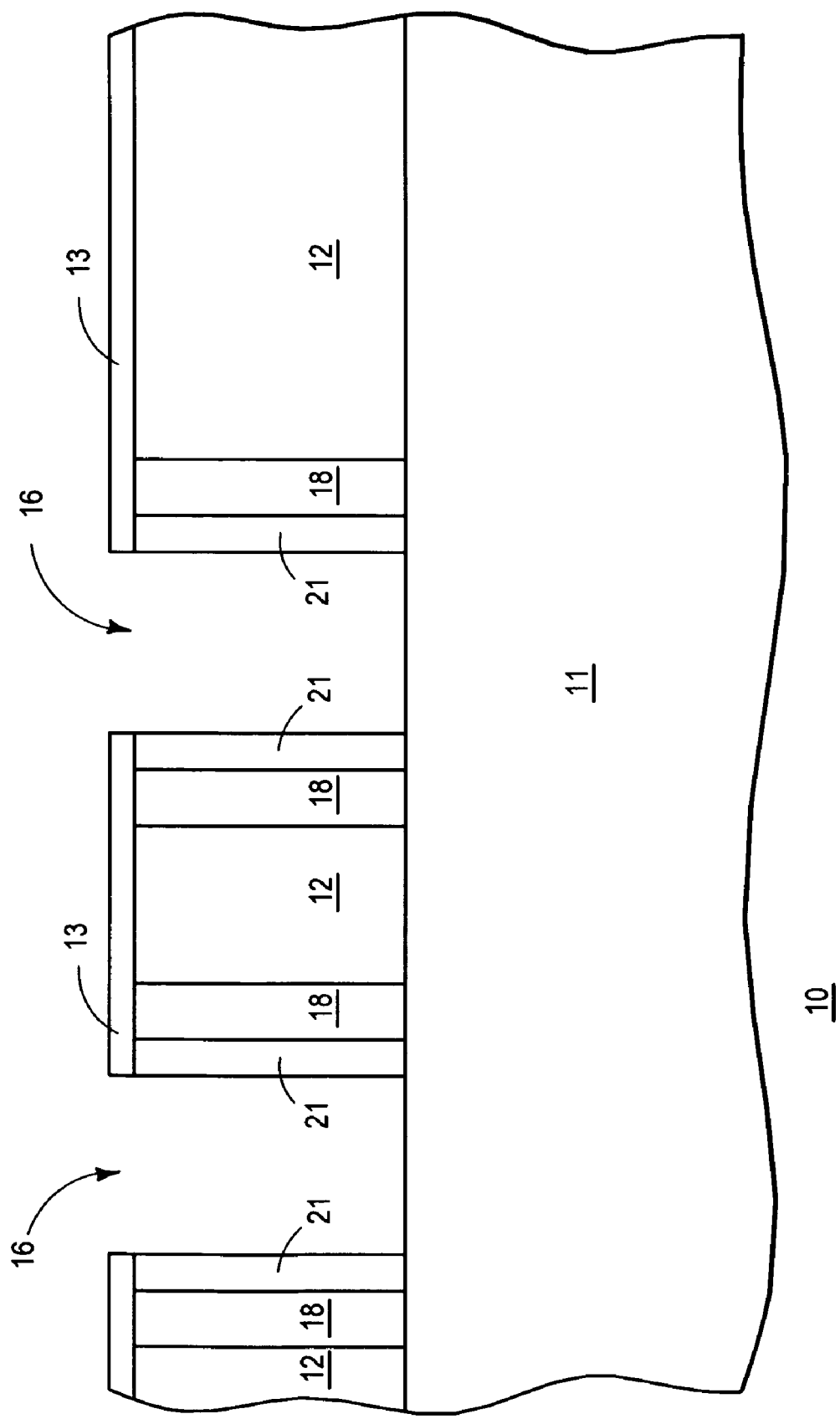

FIG. 6 schematically illustrates a portion of a subsequent stage in a method of forming transistor 10. The first portion of the sidewalls of opening 16 are again doped by forming a second doping material 19 with a conductivity type that is opposite to the conductivity type of material 17 is also formed along the sidewalls of opening 16. Material 19 preferably is formed using the same methods that were used to form material 17. Using the same methods for forming both materials 17 and 19 facilitates providing substantially the same charge uniformity for regions 18 and 21. As illustrated by FIG. 7, material 19 is subsequently used to form second doped region 21 within layer 12 and positioned between each region 18 and the adjacent sidewall of opening 16. In order to form region 21, an annealing operation may be utilized subsequent to forming material 19, or the heat from subsequent processing operations may be utilized to distribute the dopant from material 19 into layer 12. Thus, material 19 may be driven into layer 12 to form region 21 at this stage of the method or may be driven-in during later processing operations. Region 18 is formed in a portion of layer 12 that is juxtaposed to the sidewalls of an opening 16, and region 21 is positioned within layer 12 between region 18 and the sidewall of opening 16. It should be noted that region 18 is adjacent to but not touching the sidewall of opening 16. The type of doping material used for materials 17 and 19 and the respective donor and acceptor concentrations thereof are selected to provide both regions 18 and 21 with substantially equal charge concentration along the slices of the horizontal cross-sections of transistor 10. In the preferred embodiment, the charge concentration of regions 18 and 21 is substantially balanced with both regions 18 and 21 having a charge concentration of about 1E12 atoms/cm$^2$. Any process variation that occurs for one of regions 18 and 21 will apply to both regions 18 and 21 and will maintain the charge balance. This balanced charge concentration has a variation along the vertical depth of regions 18 and 21 of no more than about plus or minus ten percent (10%). It is believed that this doping concentration is optimum to provide the super-junction depletion action that is desired for regions 18 and 21. The charge concentration of holes and electrons is determined according to the equations:

$$Qp=1/(q(Mp)(Rsp))$$

where:
Qp=is the hole charge concentration (atoms/cm$^2$)
q=electron charge (coulomb)
Mp=hole mobility (cm$^2$/(volt-sec.))
Rsp=is the sheet resistance of region 21 (ohm per square).

$$Qn=1/(q(Mn)(Rsn))$$

where:
Qn=is the electron charge concentration (atoms/cm$^2$)
q=hole charge (coulomb)
Mn=electron mobility (cm$^2$/(volt-sec.))
Rsn=is the sheet resistance of region 18 (ohm per square).

To achieve the balanced charge concentration, regions 18 and 21 are formed to have Qp approximately equal to Qn. It should be noted that region 18 and layer 12 have the same doping type, thus, the doping of layer 12 will contribute to the total charge of regions 12 and 18.

Figure 8:
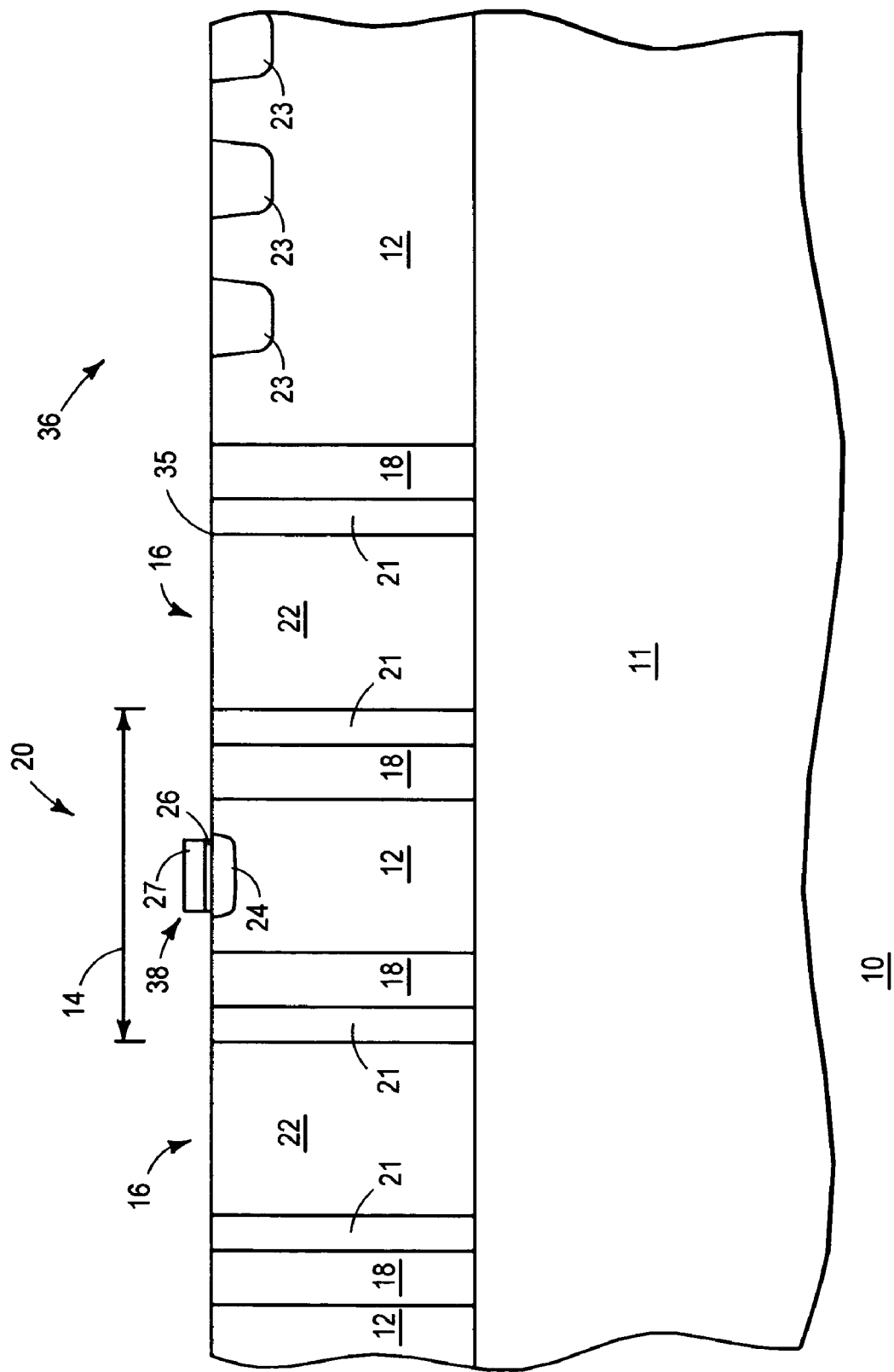
FIG. 8 schematically illustrates an enlarged cross-sectional portion of the super-junction field effect transistor of FIG. 1 at a subsequent stage according to a portion of an embodiment of a method in accordance with the present invention.

FIG. 8 schematically illustrates a subsequent stage according to a portion of an embodiment of a method of forming transistor 10. After forming regions 18 and 21, a filler material 22 is formed in openings 16 in order to isolate an active region 20 of transistor 10 from other devices formed on substrate 11. Typically material 22 is deposited into openigns 16. Material 22 is a material that does not substantially contribute charge to regions 18 and 21. Active region 20 is denoted in a general way by an arrow and typically is within the portion of layer 12 bounded by the sidewalls of openings 16 as shown by distance 14. Suitable materials for material 22 are well known to those skilled in the art and include materials such as silicon dioxide, silicon nitride, undoped polysilicon, silicon oxide-nitride or combinations thereof. Insulator layer 13 typically is removed after the process of filling openings 16.

Active region 20 of transistor 10 is formed in the portion of layer 12 between openings 16. An optional channel enhancement 24 typically is formed on the surface of the portion of layer 12 within active region 20. Enhancement 24 generally is positioned laterally near the center of region 20. Thereafter, a gate insulator 26 and a gate electrode 27 are formed on the surface of layer 12 overlying enhancement 24. Insulator 26 and electrode 27 form a gate 38 of transistor 10. An insulator 28 isolates a source electrode 34 from gate electrode 27. A termination region 36 of transistor 10 typically is formed to extend laterally away from an edge 35 of opening 16 that is distal from active region 20. Region 36 extends laterally away from edge 35 and region 20 and is used to distribute the electric field of the voltage applied to transistor 10 as is well known to those skilled in the art. Termination rings 23 are formed in the surface of layer 12 within region 36 and extend vertically into layer 12 to assist in distributing the electric field. Transistor 10 may have between six to ten or more termination rings 23 although only three are shown for clarity of the drawings. Enhancement 24, insulator 26, electrode 27, and termination rings 23 are formed by techniques that are well known to those skilled in the art.

It should be noted that within active region 20, regions 18 and 21 may have widths sufficient for regions 18 to merge or to overlap in the portion of layer 12 underlying gate 38, or alternatively may leave a portion of layer 12 underlying gate 38. Also, within region 36, doped regions 18 and 21 are formed in layer 12 adjacent to edge 35 of the sidewall that bounds region 36. These regions 18 and 21 within region 36 generally are formed as a result of the method of forming materials 17 and 19 on the sidewalls of openings 16. No additional operations generally are required to form regions 18 and 21 within region 36. As will be seen hereinafter, these regions 18 and 21 within region 36 further assist, in addition to rings 23, in depleting region 36 during reverse operation of transistor 10.

Figure 9:
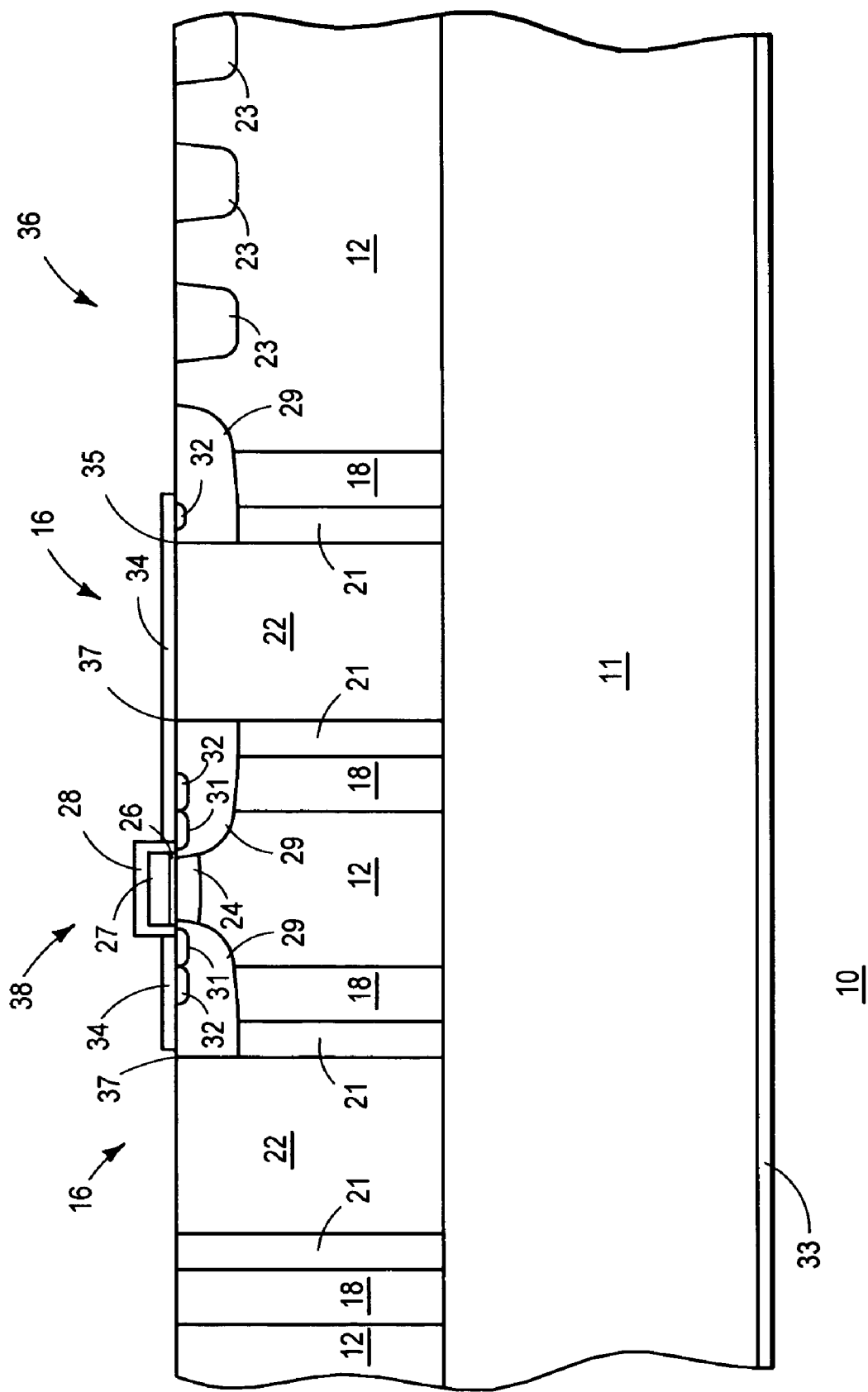
FIG. 9 schematically illustrates an enlarged cross-sectional portion of the super-junction field effect transistor of FIG. 1 at a subsequent stage of an embodiment of a method in accordance with the present invention.

FIG. 9 illustrates transistor 10 at a subsequent stage of formation according to an embodiment of a method of forming transistor 10. Body regions 29 are formed within layer 12 to extend vertically from the surface of layer 12 a distance into layer 12. Regions 29 also extend from a proximal edge 37 of the sidewalls of opening 16 laterally toward enhancement 24 and gate 38. Typically, body regions 29 touch or may even overlap a portion of enhancement 24. Regions 29 generally overlap the portion of regions 18 and 21 that are near the surface of layer 12. Subsequently, gate 38 is used as a mask to form sources 31 that are self-aligned to gate 38 and within body regions 29. Sources 31 are formed on the surface of layer 12 by techniques that are well known to those skilled in the art. Thereafter, body contacts 32 are formed within regions 29 to provide good electrical contact to regions 29.

When transistor 10 is enabled to conduct, current flows from sources 31 through enhancement 24 to regions 18. The high charge concentration of regions 18 forms low resistance conduction paths to substrate 11 and electrode 33. When transistor 10 is reverse biased, the uniform charge concentrations regions 18 and 21 facilitate regions 21 depleting most of regions 18 of carriers which enhances the breakdown voltage of transistor 10. Additionally, region 21 within region 36 also depletes the corresponding region 18 and assists in spreading the depletion region through all of region 36 to further increase the breakdown voltage.

In one example embodiment of transistor 10 that has a breakdown voltage of approximately six hundred (600) volts, substrate 11 is formed with an N-type doping concentration of approximately $1E19$ atoms/cm². Layer 12 is epitaxial formed on substrate 11 to a thickness between about fifty (50) to sixty (60) microns with an N-type doping concentration of approximately $2E14$ atoms/cm² and a resulting resistivity in the range of approximately twenty (20) ohm-centimeter. Openings 16 are each formed to have a width of about two to six (2–6) microns with distance 14 about seven to twelve (7–12) microns. An angled implant at an angle of approximately seven degrees is utilized to form N-type material 17 with an implant dose between about 1.0 to $6.0E13$ atoms/cm². Subsequently, material 17 is driven into layer 12 at a temperature of around twelve hundred (1200) degrees Celsius for approximately thirty (30) minutes. The resulting width of region 18 is about two to four microns. Material 19 is then formed using an angle implant to form P-type material 19 at a dose of approximately 1.0 to $6.0E13$ atoms/cm². The implant angle is the same angle used for forming material 17. Material 19 is subsequently driven-in during the drive-in used for forming body regions 29. The resulting width of region 21 is approximately 0.5 to 2.0 microns. Using the same angle implant to form both material 17 and 19 facilitates regions 18 and 21 having substantially similar doping profiles along the vertical direction or depth of the sidewalls of opening 16.

Using the same type of operation to form both materials 17 and 19 of transistor 10 results in a self-compensation charge balance between regions 18 and 21. Since the same type of operation is used to form both materials 17 and 19, any variation of the charge concentration in a vertical direction within region 18 will also be mirrored at the same point of the vertical direction within region 21. Thus, regions 18 and 21 have similar or uniform doping profiles. This self-compensation charge balance minimizes the influence of variations within layer 12 upon the breakdown voltage of transistor 10. Forming regions 18 and 21 to extend from substrate 11 at least up to body regions 29 and preferably to the surface of layer 12 provides better control of the breakdown voltage of transistor 10 and increases the manufacturing yields thereby reducing the cost of transistor 10. The uniform doping also facilitates using standard lightly doped epitaxial material for layer 12 which also assists in reducing the cost. The lightly doped epitaxial material simplifies the structure within termination region 36.

Figure 10:
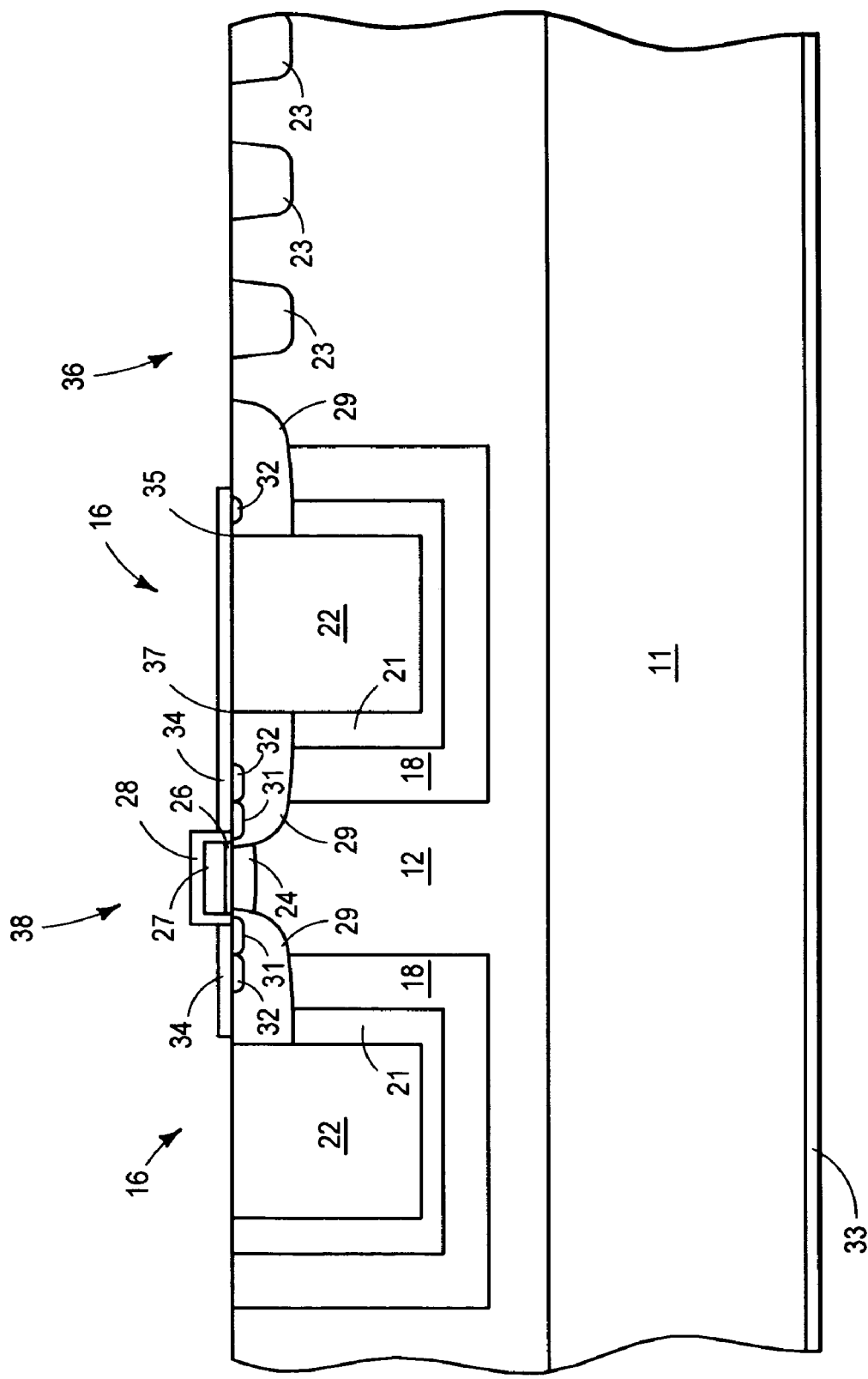
FIG. 10 schematically illustrates an enlarged cross-sectional portion of an alternate embodiment of the super-junction field effect transistor of FIG. 9 in accordance with the present invention.

FIG. 10 schematically illustrates an enlarged cross-sectional portion of a super-junction field effect transistor 100 that is an alternate embodiment of super-junction field effect transistor 10 that is explained in the description of FIG. 1 through FIG. 9. As illustrated in FIG. 10, openings 16 are formed to extend a first depth into but not through layer 12. Material 17 and 19 are formed on the bottom of opening 16 as well as on the sidewalls. Thus, the resulting regions 18 and 21 extend into layer 12 from the bottom of opening 16 as well as the sidewalls. A portion of region 18 is juxtaposed to the bottom of opening 16 and a portion of region 21 is between layer 18 and the bottom of opening 16. The depth of opening 16 generally is formed to allow no greater than about twenty microns of layer 12 between the bottom of region 18 and the bottom layer 12. Such a depth minimizes the Rdson.

In view of all of the above, it is evident that a novel method and device are disclosed. Doping through the sidewalls of openings 16 in order to form regions 18 and 21 facilitates balancing the charge between regions 18 and 21. The balanced charge provides better control of the breakdown voltage. Also forming regions 18 and 21 by doping through the sidewalls reduces the costs of the resulting device. The method facilitates using a lightly doped epitaxial layer which allows using a simpler structure in the termination region.

While the invention is described with specific preferred embodiments, it is evident that many alternatives and variations will be apparent to those skilled in the semiconductor arts. Although each sidewall is illustrated to have only one pair of one regions 18 and 21, additional pairs may be formed juxtaposed to the pair that is illustrated. Additionally, the invention has been described for a particular N-channel transistor structure, although the method is directly applicable to P-channel transistors, as well as to other MOS structures such as lateral MOS devices, J-FETs, bipolar devices, IGBT's, and diodes. It should be noted that for some embodiments, layer 12 may be omitted in which case regions 18 and 21, openings 16, body regions 29, and other portions of transistor 10 could be formed within substrate 11. Those skilled in the art will realize that transistor 10 may be one cell of a multi-cell transistor. In some cases, a transistor may have hundreds or thousands of such transistor cells in order to form a transistor with large current carrying capability. Also, distance 14 of each cell of the multi-cell transistor may vary and not be precisely the same distance.

What is claimed is:

1. A method of forming a semiconductor device comprising:
providing a substrate of a first conductivity type;
forming a doped layer of the first conductivity type on at least a portion the substrate;
forming a first opening in the doped layer wherein the first opening has sidewalls;
doping a first region of the doped layer juxtaposed to at least a portion of the sidewalls of the first opening to form a first doped region along the sidewalls and extending into the doped layer leaving a first portion of the doped layer adjacent to the first doped region and distal from the first opening;
doping a second region of the doped layer between the first region and the sidewalls to form a second doped region along the sidewalls between a portion of the first doped region and the sidewalls wherein the second doped region has a conductivity that is opposite to a conductivity of the first doped region; and
forming a transistor on the substrate wherein the second doped region remains distinct from the first doped region.

2. The method of claim 1 wherein doping the first region of the doped layer juxtaposed to at least the portion of the sidewalls of the first opening includes forming a first doping material on a first portion of the sidewalls and driving dopants from the first doping material into the doped layer.

3. The method of claim 2 wherein doping the second region of the doped layer between the first region and the sidewalls includes forming a second doping material on the first portion of the sidewalls.

4. The method of claim 3 wherein forming the first doping material on the first portion of the sidewalls and forming the second doping material on the first portion of the sidewalls includes implanting the first portion of the sidewalls through the first opening.

5. The method of claim 3 further including driving dopants from the second doping material into the first region.

6. The method of claim 3 wherein forming the first doping material on the first portion of the sidewalls and forming the second doping material on the first portion of the sidewalls includes forming a layer of doped material on the sidewalls of the first opening.

7. The method of claim 1 wherein forming the first opening in the doped layer includes forming the first opening through the doped layer and exposing a portion of a surface of the substrate.

8. The method of claim 1 further including forming a source of the semiconductor device overlying the first portion of the doped layer operable to form a current conduction path through the first doped region.

9. The method of claim 1 further including forming a body region in the first doped region and extending a first distance away from the first opening through the first doped region and into the first portion of the doped layer.

10. A method of forming a high breakdown voltage transistor comprising:
providing a semiconductor material of a first conductivity type;
forming a first opening in the semiconductor material including forming sidewalls of the first opening;
doping a first region of the semiconductor material through the first opening including doping the first region with the first conductivity type to form a first doped region of the first conductivity type along the sidewalls and extending into the semiconductor material and leaving a first portion of the semiconductor material that is adjacent to the first doped region and substantially parallel to and distal from the first opening;
doping a second region of the semiconductor material between a portion of the first doped region and a first portion of the sidewalls of the first opening including doping the second region with a second conductivity type that is opposite to the first conductivity type to form a second doped region of the second conductivity type along the sidewalls between a portion of the first doped region and the sidewalls; and
forming a transistor on the substrate wherein the second doped region remains distinct from the first doped region.

11. The method of claim 10 wherein doping the first region of the semiconductor material includes positioning a first doping material of the first conductivity type along at least a second portion of the sidewalls of the first opening.

12. The method of claim 11 wherein positioning the first doping material of the first conductivity type includes using the first doping material to form the first doped region in the semiconductor material juxtaposed to the first opening.

13. The method of claim 11 wherein positioning the first doping material of the first conductivity type along at least the second portion of the sidewalls includes positioning the first doping material through the first opening.

14. The method of claim 11 wherein doping the second region of the semiconductor material includes positioning a second doping material of the second conductivity type along the second portion of the sidewalls of the first opening.

15. The method of claim 10 wherein doping the second region of the semiconductor material between the portion of the first region and the first portion of the sidewalls of the first opening includes forming a second doping material along at least a second portion of the sidewalls of the first opening.

16. The method of claim 10 further including a second opening in the semiconductor material and first distance from the first opening including forming sidewalls of the second opening.

17. The method of claim 16 further including positioning a first doping material along at least a first portion of the sidewalls of the second opening;
using the first doping material to form a third doped region in the semiconductor material juxtaposed to the second opening;
positioning a second doping material along at least the first portion of the sidewalls of the second opening; and
using a second doping material to form a fourth doped region in the semiconductor material between the third doped region and the first portion of the sidewalls of the second opening.

18. The method of claim 17 further including forming a plurality of fifth doped regions of the second conductivity type in the semiconductor material and spaced apart from the third doped region and the fourth doped region.

19. The method of claim 10 further including forming a plurality of third doped regions of the second conductivity type on a surface of the semiconductor material and spaced apart from the second doped region.

20. The method of claim 10 further including forming a body region in the first doped region and extending a first distance away from the first opening through the first doped region and into the first portion of the semiconductor material.

* * * * *